United States Patent [19]

Balaban et al.

[11] 4,200,811
[45] Apr. 29, 1980

[54] FREQUENCY DIVIDER CIRCUIT

[75] Inventors: Alvin R. Balaban, Lebanon; Steven A. Steckler, Clark, both of N.J.

[73] Assignee: RCA Corporation, New York, N.Y.

[21] Appl. No.: 904,849

[22] Filed: May 11, 1978

[51] Int. Cl.² .......................................... H03K 23/08
[52] U.S. Cl. ................................. 307/225 R; 307/303
[58] Field of Search ............... 307/220 R, 225 R, 303, 307/221 R

[56] References Cited

U.S. PATENT DOCUMENTS

| 3,655,999 | 4/1972 | Wiedman | 307/221 R |
| 3,728,561 | 4/1973 | Brocker | 307/225 R |
| 3,818,251 | 6/1974 | Hoehn | 307/225 R |
| 3,996,478 | 12/1976 | Kasperkovitz | 307/225 R |

OTHER PUBLICATIONS

"The Bipolar LSI Breakthrough", by Wiedman appearing in *Electronics* Part 1, pp. 89–95, 9-4-75 & Part 2, pp. 99–103, 10-2-75.

Primary Examiner—John S. Heyman
Attorney, Agent, or Firm—Paul J. Rasmussen; Allen LeRoy Limberg; Peter M. Emanuel

[57] ABSTRACT

A relatively high speed, high density integrated circuit for dividing the frequency of an alternating signal includes first and second semiconductor boats formed on a substrate. The first boat includes a plurality of transistors having the semiconductor material of the boat as a common emitter region. The second boat includes a plurality of transistors having the semiconductor material of the boat as a common collector region. Pairs of transistors of the first boat and pairs of transistors of the second boat are coupled together in cross coupled configurations to form flip-flop stages. Complementary clock signals derived from the alternating signal are coupled to alternate stages. In each stage, the pair of transistors of the second boat are arranged as emitter followers to bias the pair of transistors in the first boat so that only one transistor of the pair is conductive at a time independent of the associated clock signal level. A resistor coupled between the common emitter region of the first boat and a source of operating potential limits the current flowing through conductive transistors of the first boat below their saturation current. Pairs of transistors in the second boat, also arranged as emitter followers, couple signals representing the conduction states of one stage to the next stage in response to a predetermined level of the clock signals to control the conduction states of the next stage.

10 Claims, 5 Drawing Figures 4,200,811

FREQUENCY DIVIDER CIRCUIT

BACKGROUND OF THE INVENTION

The present invention relates to the field of frequency divider circuits, especially those useful in integrated circuit arrangements.

With respect to frequency divider circuitry presently used in integrated circuit arrangements, there is a conflict between those circuits which are capable of operating at relatively high speeds, i.e., high frequencies, and those which provide relatively dense integrated circuit structures, i.e., integrated circuit structures with a relatively large number of divider stages per unit area. $I^2L$ (Integrated Injection Logic) integrated circuits are relatively dense structures because they employ bipolar transistors formed in an area of semiconductor material, sometimes called a boat, which serves as a commonly shared emitter region. Unfortunately, because of the circuit arrangement of $I^2L$ circuits, the current flowing through the component transistors cannot be readily controlled. As a result, the component transistors tend to reach a saturated or high current stage which limits the operating speed of the integrated circuit. TTL (Transistor Transistor Logic) and ECL (Emitter Coupled Logic) integrated circuits are capable of operating at relatively high speeds because the current flowing through the component transistors can be controlled to be below the saturation level. Unfortunately, these types of structures employ arrangements in which the component bipolar transistors for the most part do not all share a common electrode region. As a result, these integrated circuit structures have relatively low densities. Although integrated circuits utilizing field effect transistors arranged in logic configurations such as N-MOS (N-channel Metal Oxide Semiconductor), P-MOS (P-channel Metal Oxide Semiconductor) and C-MOS (Complementary Metal Oxide Semiconductor) integrated circuits have relatively high densities, their speeds are limited by relatively large interelectrode capacitances considering the currents present in these devices. In addition, MOS integrated circuits operate at voltage levels which are not directly compatible with bipolar circuitry which may be employed in analog circuitry associated with the frequency division circuitry.

SUMMARY OF THE PRESENT INVENTION

A relatively high speed, high density integrated circuit for dividing the frequency of an alternating signal includes first and second semiconductor boats formed on a single substrate. The first boat includes a plurality of bipolar transistors having the semiconductor material of the boat as a commonly shared emitter region. The second boat includes a plurality of transistors having the semi-conductor material of the boat as a commonly shared collector region. Pairs of transistors in the first boat are coupled to pairs of transistors in the second boat in a cross coupled configuration to form flip-flop stages. Complementary clock signals derived from the alternating signal are coupled to alternate stages. Each stage includes bias means including the pair of transistors in the second boat to ensure that only one of the transistors in the pair of transistors in the first boat is conductive at a time and that the current flowing through the conductive transistor is below its saturation current. Coupling means, interposed between each stage, transfer the conduction states of one stage to the next stage in response to a predetermined level of the clock signals.

DETAILED DESCRIPTION OF THE DRAWING

Figure 1:
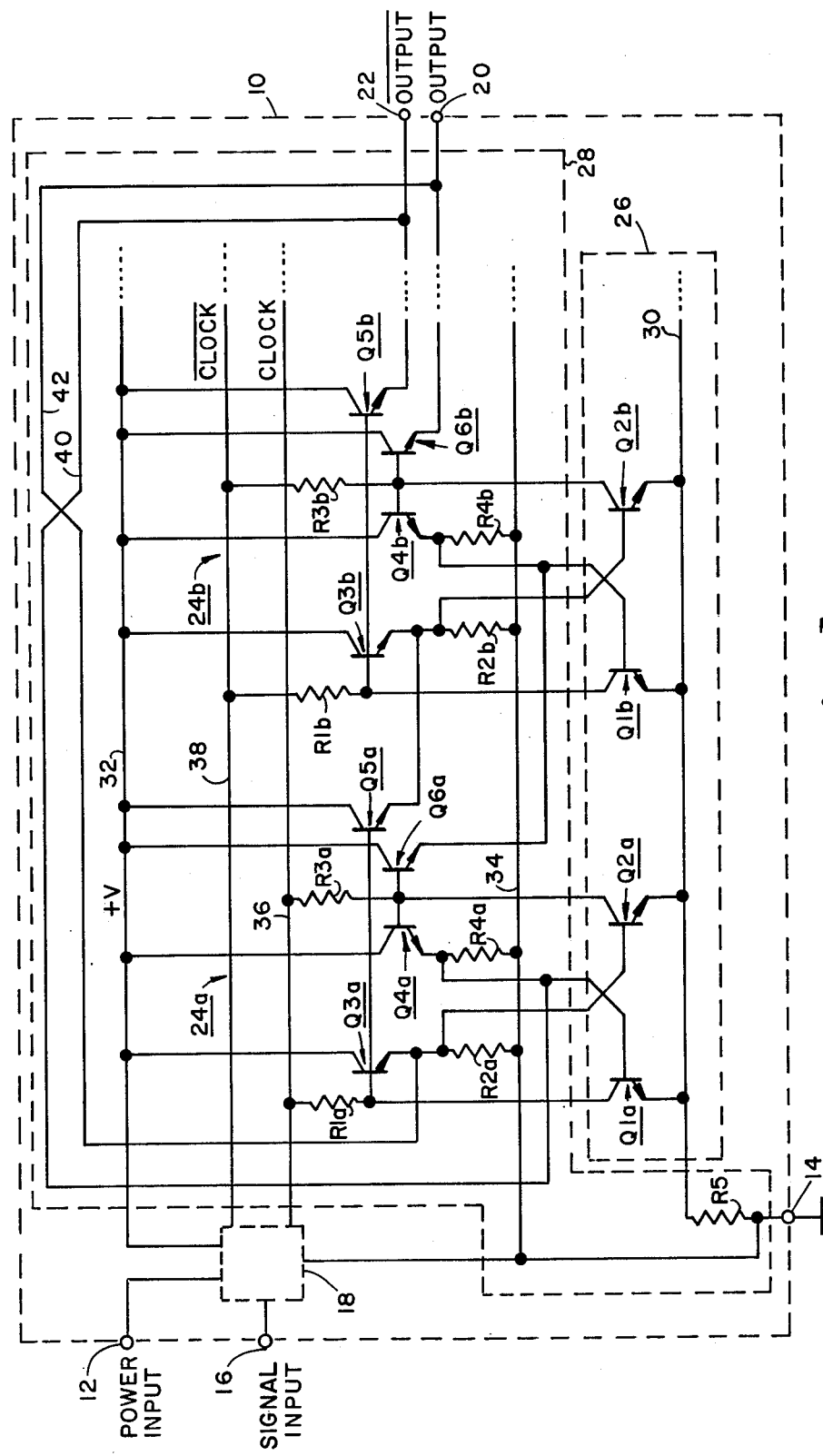
FIG. 1 shows in schematic form an integrated circuit constructed in accordance with the present invention.

Integrated circuit 10 shown in FIG. 1 is arranged as a frequency divider for dividing the frequency of an alternating input signal. Integrated circuit 10 includes a number of terminals for interfacing it with external circuitry (not shown). The function associated with these terminals is listed in the following table.

| Terminal | Function |
| --- | --- |
| 12 | Power Input |
| 14 | Signal Ground |
| 16 | Signal Input |
| 20 | OUTPUT Signal |
| 22 | $\overline{\text{OUTPUT}}$ Signal |

Figure 2:
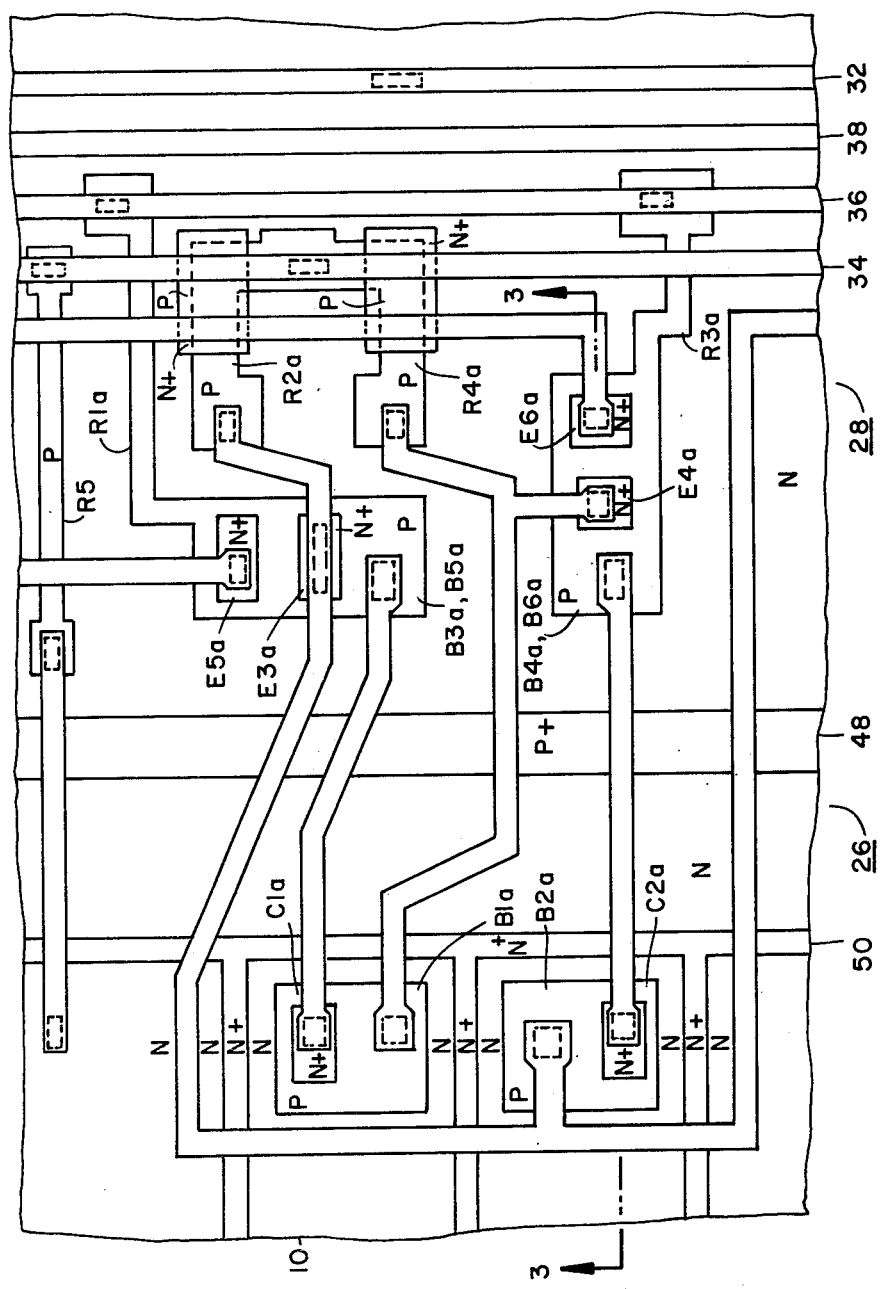
FIG. 2 shows a plan view of the semiconductor structure of a portion of the integrated circuit shown in FIG. 1.
Figure 3:
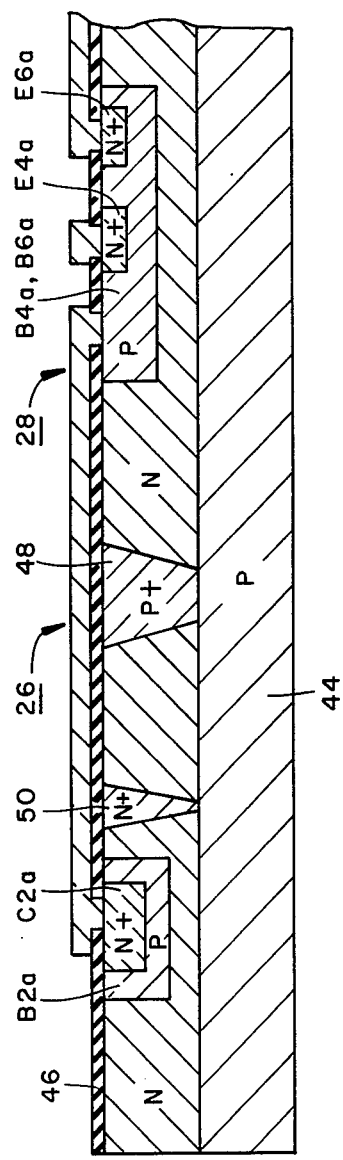
FIG. 3 shows a cross sectional view of a portion of the structure shown in FIG. 2 taken in the direction of section lines 3—3.

Integrated circuit 10 includes a circuit 18 (shown in detail in FIG. 5) for deriving a supply voltage, +V, from the voltage applied to power input terminal 12 and complementary clock signals, CLOCK and $\overline{\text{CLOCK}}$ (graphically represented in FIG. 4) from the alternating signal input applied to signal input terminal 16. The remaining portion of integrated circuit 10 includes n similarly arranged flip-flop stages coupled in cascade. Only the first stage, 24a, and the second stage, 24b, are shown in FIG. 1. Integrated circuit 10 is partitioned into a first portion or "boat" 26 and a second portion or "boat" 28 formed on a single substrate (as is shown in FIGS. 2 and 3). Boat 26 includes a plurality of transistors which share a common emitter region symbolically represented in FIG. 1 by a conductor 30. Boat 28 includes a plurality of transistors which share a common collector region symbolically represented in FIG. 1 by a conductor 32. The supply voltage +V is coupled to conductor 32.

Specifically, stage 24a includes NPN transistors Q1a and Q2a in common emitter boat 26 and NPN transistors Q3a and Q4a in common collector boat 28. Stage 24a is coupled to stage 24b through NPN transistors Q5a and Q6a in common collector boat 28. The bases of transistors Q1a and Q2a in common emitter boat 26 are connected to the emitters of transistors Q4a and Q3a, respectively, in common collector boat 28. The collectors of transistors Q1a and Q2a in common emitter boat 26 are connected to the bases of transistors Q3a and Q4a, respectively, in common collector boat 28. The emitters of transistors Q1a and Q2a as well as the emitters of all of the remaining transistors in common emitter boat 26 are coupled through a single resistor R5, located in common collector boat 26, to a conductor 34. Conductor 34 is coupled to signal ground terminal 14.

In common collector boat 28, emitters of transistors Q3a and Q4a are coupled to conductor 34 through resistors R2a and R4a, respectively. The bases of transistors Q3a and Q4a are coupled to a conductor 36 through resistors R1a and R3a, respectively. The CLOCK signal generated by circuit 18 is applied to conductor 36.

It will be noted that transistors Q1a and Q2a are arranged in common emitter configurations which have inputs at the respective bases and outputs at the respective collectors. It will also be noted that transistors Q3a and Q4a are arranged in emitter follower configurations with inputs at the respective bases and outputs at the respective emitters.

The bases of transistors Q3a and Q4a are coupled to the bases of transistors Q5a and Q6a, respectively, in common collector boat 28. Transistors Q5a and Q6a are also arranged in emitter follower configurations. As will be seen in FIGS. 2 and 3, transistors Q3a and Q5a and transistors Q4a and Q6a share common base regions symbolically represented by conductors in FIG. 1.

The emitters of transistors Q5a and Q6a of stage 24a, which are the output points of stage 24a, are coupled to the bases of transistors Q2b and Q1b, respectively, of stage 24b, which are the input points of stage 24b. Stage 24b is similar to stage 24a and is therefore shown as having similar reference designations (with the exception that the letter "a" has been replaced by the letter "b"). However, it should be noted that the bases of transistors Q3b and Q4b of stage 24b are coupled to a conductor 38 rather than to conductor 36. The $\overline{\text{CLOCK}}$ signal generated by circuit 18 is applied to conductor 38.

The output points of stage 24b at the emitters of transistors Q5b and Q6b are coupled to the respective input points of the next stage after stage 24 in the same manner as the output points of stage 24a at the emitters of transistors Q5a and Q6a are coupled to the input points of stage 24b at the bases of transistors Q2b and Q1b, respectively. The next stage after stage 24b, like stage 24a, is coupled to conductor 36 (i.e., to the CLOCK signal) and the next stage after that is coupled, like stage 24b, to conductor 38 (i.e., to the $\overline{\text{CLOCK}}$ signal). Conductors 36 and 38 are coupled to the remaining stages in the same alternating fashion.

The last, i.e., nth, stage is coupled to the first stage, i.e., stage 24a, to form a closed loop configuration. However, unlike the output-input relationship followed in the remainder of integrated circuit 10, the output-input relationship between the last stage and the first stage is reversed, as is indicated by the arrangement of conductors 40 and 42. That is, assuming integrated circuit 10 includes only two stages so that stage 24a is the first stage and stage 24b is the last stage, the emitter of transistor Q5b is coupled to the base of transistor Q1a rather than to the base of transistor Q2a and the emitter of transistor Q6b is coupled to the base of transistor Q2a rather than to the base of transistor Q1a.

The semiconductor structure of the circuitry shown schematically in FIG. 1 may best be understood by concurrent reference to FIGS. 2 and 3. In FIGS. 2 and 3 the bases, emitters and collectors of transistors shown in FIG. 1 are identified by reference designations with numbers corresponding to the reference designations utilized in FIG. 1 and with prefixes B, C and E for base, emitter and collector, respectively. For example, the base of transistor Q2a is identified by the reference designation B2a. Furthermore, the connection of metallization to the various semiconductor elements of integrated circuit 10 is indicated by a rectangle shown in phantom.

Common emitter boat 26 and common collector boat 28 are epitaxial layers of N-type material, e.g., silicon, grown on a common substrate 44 of P-type material, e.g., silicon. The N-type material of boat 26 comprises the common emitter region of all the transistors in boat 26. The base of each transistor of boat 26 is a respective area of P-type material diffused in the N-type material of boat 26 and the collector of each transistor of boat 26 is an area of N+-type material (the + indicating more heavily doped semiconductor material) diffused in the P-type material of the corresponding base areas. The N-type material of boat 28 comprises the common collector region of all the transistors of boat 28. The base of each transistor of boat 28 is a respective area of P-type material diffused in the N-type material of boat 28 and the emitter of each transistor of boat 28 is an area of N+-type material diffused in the P-type material of the corresponding base areas. As earlier indicated, transistors Q3a and Q5a and transistors Q4a and Q6a share common base regions. A thin layer 46 (not shown in FIG. 2) of oxidized material, e.g., silicon oxide, is located between the metallization and semiconductor material, except in the areas of the phantom rectangle, to electrically insulate the semiconductor material from metallization.

Boats 26 and 28 are separated by a barrier 48 of P+-type material which is diffused between the N-type material of boats 26 and 28. Barrier 48 is in contact with substrate 44 which is coupled to ground through ground terminal 14 by means not shown. Since ground potential is the lowest potential developed in integrated circuit 10, both P-N diode junctions formed by barrier 48 and the N-type material of boats 26 and 28 on either side of barrier 48 are reverse biased and boats 26 and 28 are effectively electrically isolated from one another. P+ material rather than P material is utilized in barrier 48 to inhibit the formation of lateral NPN transistors with sufficient gain to exhibit an appreciable influence on the operation of integrated circuit 10. Barrier 48 has a typical width of 0.4 millimeters.

In boat 26, a guard band 50 of diffused N+-type material is diffused in the N-type material surrounding at least a portion of P-type material of the base areas to inhibit the formation of lateral PNP transistors with any appreciable gain. Guard band 50, however, does not interrupt the conduction of the N-type material of common emitter boat 26, i.e., the common emitter region of the transistors of boat 26 is not discontinuous. Guard band 50 has a considerably smaller width, e.g., 0.2 millimeters, than does barrier 48. Typically, the ratio of the widths of barrier 48 and guard band 50 is in the order of 2 to 1.

It is noted that a guard band for inhibiting the formation of lateral PNP transistors between the P-type material of the base areas of boat 28 is not required because the N-type material which comprises the common collector region of all the transistors of boat 28 is coupled to the +V supply voltage through conductor 32. Since the +V supply voltage is the highest potential developed in integrated circuit 10, any PNP lateral transistor that may be formed in common collector boat 28 is rendered nonconductive, i.e., has its base to emitter and base to collector junctions reverse biased.

Resistors in common collector boat 28 are formed by areas of P-type material. The resistance values of resistors R1a, R3a and R5 are determined by the dimensions of the corresponding P-type area. The resistance values of resistors R2a and R4a are made relatively large compared to the resistance values of resistors R1a, R3a and R5 by the diffusion of N+-type material in the corresponding P material to form, in cross section (not shown), a sandwich-like arrangement of P-type material between N+-type material on the top and N-type material on the bottom. The sandwich-like arrangement tends to limit or "pinch" the conduction of the P-type material and hence resistors like resistors R2a and R4a are often referred to as pinch resistors. While resistor R5 could be formed in common emitter boat 26, it is desirable that it be formed in common collector boat 28 so that metallization for coupling resistor R5 between the common emitter region of boat 26 and conductor 38 does not have to cross over other metallization.

Because all the transistors in boat 26 share a common emitter region, its density, i.e., the number of transistors per unit of surface area, is relatively large. Similarly, because all the transistors in boat 28 share a common collector region, its density is relatively large. As a result, the overall density of integrated circuit 10 is relatively large. As will be explained below, because of the arrangement of the transistors in common collector boat 28, the transistors of common emitter boat 26 are inhibited from operating in a saturated condition. As a result, integrated circuit 10 is capable of operating at relatively high frequencies.

For the reasons set forth below in the description of the operation of integrated circuit 10, it is desirable that all the transistors of integrated circuit 10 are selected to develop approximately the same base to emitter junction voltage drop Vbe, e.g., 0.7 volts, when conductive and that resistors R1a, R3a, etc. are all selected to have a resistance value substantially equal to the resistance value of resistor R5 multiplied by a factor n/2. Under these conditions, as will be shown below, the voltage developed across resistor R1a when transistor Q1a is conductive, etc., is ½Vbe, e.g., approximately 0.35 volts. Furthermore, it is desirable that resistors R2a, R5a, etc., are all selected to have a relatively high resistance value compared to the resistance value of resistors R1a, R3a, etc. Still further, it is desirable that circuit 18 is arranged so that the pulses of the CLOCK and $\overline{\text{CLOCK}}$ signals have a high level of 3Vbe, e.g., approximately 2.1 volts, and a low level of 2Vbe, e.g., approximately 1.4 volts.

Figure 4:
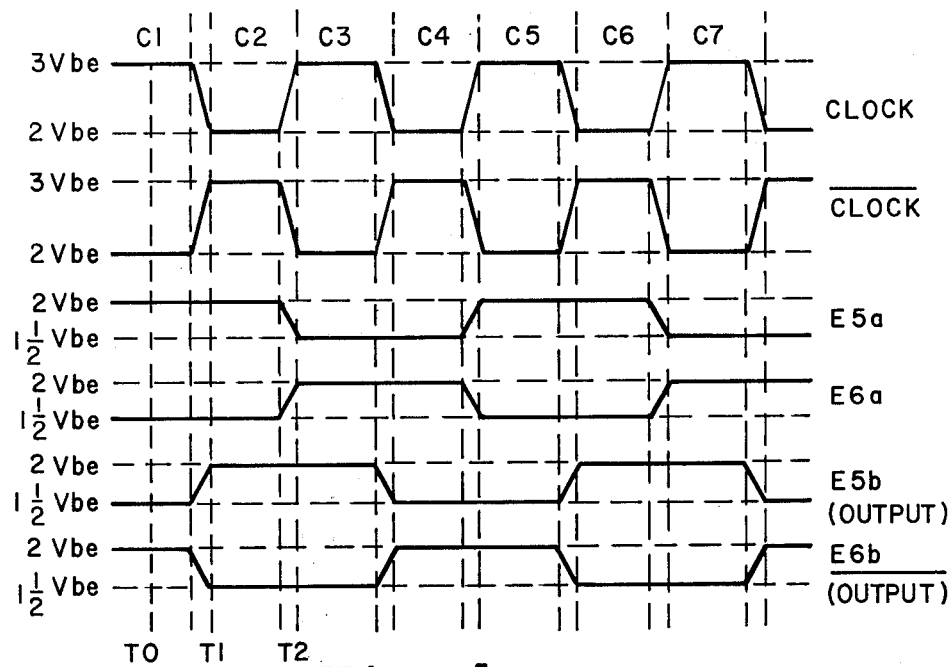
FIG. 4 shows graphical representations of signal waveforms useful in understanding the operation of the integrated circuit shown in FIG. 1.

The operation of integrated circuit 10 may best be understood by concurrent reference to FIGS. 1 and 4. In the following description it is assumed that integrated circuit 10 includes only two stages, e.g., 24a and 24b, so that the emitter of transistor Q5b is coupled through conductor 40 to the base of transistor Q1a and the emitter of transistor Q6b is coupled through conductor 42 to the base of transistor Q2a. In this arrangement the OUTPUT and $\overline{\text{OUTPUT}}$ signals are developed at the emitters of transistors Q6b and Q5b, respectively.

Furthermore, it is assumed that at initial time T0, during a first clock interval C1, when the CLOCK signal is at the high level (i.e., 3Vbe) and the $\overline{\text{CLOCK}}$ signal is at the low level (i.e., 2Vbe), transistor Q1a is nonconductive (OFF), transistor Q2a is conductive (ON), transistor Q1b is OFF and transistor Q2b is ON. Under these conditions, in stage 24a, the voltage at the base of transistor Q3a, B3a, is 2.1 volts (i.e., 3Vbe) and the voltage at the base of transistor Q4a, i.e., B4a, is 1.75 volts (i.e., 3Vbe−½Vbe). Therefore, the voltage at the emitters of transistors Q3a and Q5a, E3a and E5a, respectively, is 1.4 volts (i.e., 3Vbe−1Vbe) and the voltage at the emitters of transistors Q4a and Q6a, E4a and E6a, respectively, is 1.05 volts (e.g., 3Vbe−½Vbe−1Vbe). Since transistor Q2a is assumed to be ON, the voltage at the emitter of transistor Q2a, E2a, is 0.7 volts (i.e., 3Vbe−1Vbe−1Vbe). Since the emitter of transistor Q1a, E1a, is at the same voltage, i.e., 0.7 volts, as the emitter of transistor Q2a, E2a, and the base of transistor Q1a, B1a, is at the same voltage, i.e., 1.05 volts, as the emitter of transistor Q4a, E4a, only 0.35 volts (i.e., ½Vbe) are developed across the base to emitter junction of transistor Q1a. As a result, transistor Q1a is needed OFF as was previously assumed.

In stage 24b at time T0, the voltage at the bases of transistors Q3b and Q5b, B3b and B5b, respectively, is 1.4 volts (i.e., 2Vbe) and the voltage at the bases of transistors Q4b and Q6b, B4b and B6b, respectively, is 1.05 volts (i.e., 2Vbe−½Vbe). Since the voltage at E5a, which is coupled to the emitter of transistor Q3b, E3b, is 1.4 volts and the voltage at E6a, which is coupled to the emitter of transistor Q4b, E4b, is 1.05 volts, the base to emitter junctions of transistors Q3b and Q4b are biased OFF. Consequently, the voltage at the base of transistor Q2b, B2b, is 1.4 volts and the voltage at the base of transistor Q1b is 1.05 volts. As a result, transistor Q2b is ON and transistor Q1b is OFF as was previously assumed. Furthermore, since the voltage at E4a, which is coupled to the emitter of transistor Q5b, E5b, is 1.05 volts and the voltage at E3a, which is coupled to the emitter of transistor Q6b, E6b, is 1.4 volts, the base to emitter junctions of transistors Q5b and Q6b are biased OFF. Consequently, the voltage at E5b is 1.05 volts and the voltage at E6b is 1.4 volts.

At time T1, at the beginning of a second clock interval C2, the CLOCK signal falls to 1.4 volts (i.e., 2Vbe) and the $\overline{\text{CLOCK}}$ signal rises to 2.1 volts (i.e., 3Vbe). As will be shown, transistor Q1b remains OFF and transistor Q2b remains ON, i.e., stage 24b does not change state. However, since the $\overline{\text{CLOCK}}$ rises by 0.7 volts (i.e., 1Vbe), the voltage at B3b rises 0.7 volts to 2.1 volts and the voltage at B4b rises 0.7 volts to ;b 1.75 volts. Since transistors Q1a and Q2a, at least temporarily, remain in their previous conduction states, i.e., OFF and ON, respectively, and the CLOCK signal falls by 0.7 volts (i.e., 1Vbe), the voltages at E6b and E5b, respectively, fall initially by 0.7 volts. Consequently, transistor Q5b is rendered conductive. As a result, the voltage at E5b rises to 1.4 volts. In response, at T1, the voltage at B1a rises to 1.4 volts and transistor Q1a is rendered conductive and transistor Q2a is rendered nonconductive. Accordingly, the voltage at B3a falls to 1.05 volts (i.e., 2Vbe−½Vbe) and the voltage at B4a rises to 1.4 volts (i.e., 2Vbe).

In stage 24b, at time T1, because the voltage at B3b has risen 0.7 volts (i.e., 1Vbe) to 2.1 volts and the voltage at B4b has risen 0.7 volts to 1.75 volts, the voltage at E3b is 1.4 volts and the voltage at E4b is 1.05 volts. Accordingly, Q5a, now having its base at 1.05 volts and its emitter at 1.4 volts, and Q6a, now having its base at 1.4 volts and its emitter at 1.05 volts, are biased OFF. Furthermore, bacause the voltage at E3b is 1.4 volts and the voltage is E4b is 1.05 volts, transistor Q2b is ON and Q1b is OFF, as was previously assumed.

At a time T2, at the beginning of a third clock interval C3, the CLOCK signal rises by 0.7 volts (i.e., 1Vbe)

to 2.1 volts (i.e., 3Vbe) and the $\overline{\text{CLOCK}}$ signal falls by 0.7 volts (i.e., 1Vbe) to 1.4 volts (i.e., 2Vbe). As will be shown, stage 24a does not change states, i.e., transistor Q1a remains ON and transistor Q2a remains OFF. However, the voltage at B3a and B5a rises 0.7 volts to 1.75 volts and the voltage at B4a and B6a rises 0.7 volts to 2.1 volts. Since, at least temporarily, transistors Q3b and Q4b remain in their previous conditions, i.e., OFF and ON, respectively, the voltage at B3b initially falls by 0.7 volts to 1.4 volts and the voltage at B4b initially falls to 1.05 volts. Correspondingly, initially the voltages at E3b and B2b attempt to fall to 0.7 volts and the voltages at E4b and B1b attempt to fall to 0.35 volts. However, because the base of emitter junction of transistor Q6a is forward biased, 1.4 volts is developed at E4b. Accordingly, at time T2, transistor Q1b is rendered conductive and transistor Q2b is rendered nonconductive and the voltage developed at B4b is 1.05 volts and the voltage developed at B3b is 1.4 volts.

In stage 24a, at time T2, because the voltage at B3a has risen to 1.75 volts, the voltage at E5a is 1.05 volts. Similarly, because the voltage at B4a has risen to 2.1 volts, the voltage at E4a is 1.4 volts. As a result, the base to emitter junctions of transistors Q5b and Q6b are biased OFF. Accordingly, the voltage at E5b is 1.4 volts and the voltage at E6b is 1.05 volts. Furthermore, transistor Q2a remains OFF and transistor Q1a remains ON as earlier assumed.

It will be noted from the previous discussion that when the clock signal of a stage goes to its high level the conduction states of the transistors of that stage in boat 26, e.g., Q1a and Q2a, are not changed but one of the emitter followers in boat 28 coupling that stage to the next stage, e.g., Q5a or Q6a, depending on the conduction state of that stage, is rendered conductive. Correspondingly, when the clock line of a stage goes to its low level, the conduction states of that stage are changed and the emitter followers coupling that stage to the next stage are rendered nonconductive. It is also noted that the conduction states to which a stage changes depends on the conduction states of the transistors in the previous stage. For example, if transistor Q1a is ON and transistor Q2a is OFF when the $\overline{\text{CLOCK}}$ signal goes low, transistor Q1b is turned ON and transistor Q2b is turned OFF. In this manner, the state of the first stage is propagated to the last or nth stage in n clock pulses, i.e., in the time that it takes for n positive-going transitions of either the CLOCK or $\overline{\text{CLOCK}}$ signal to occur. So that there is a change of state at the output for every nth clock pulse, the output points of one stage, e.g., the collectors of transistors Q1b and Q2b, are coupled in inverted fashion to the input points of the next stage, e.g., the bases of transistors Q1a and Q2a. Thus, if the CLOCK signal goes low when transistor Q1b is OFF and Q2b is ON, transistor Q1a is turned ON and transistor Q2a is turned OFF. Utilizing these generalized principles of operation, the graphical representations shown in FIG. 4 of waveforms of the voltage developed at E5a, E6a, E5b when integrated circuit 10 includes only two stages may be completed for clock intervals C4 through C7.

It is further noted that transistors of a stage in common collector boat 28, e.g., transistors Q3a and Q4a, are included in a biasing arrangement such that during each clock pulse only one of the transistors of each stage in common emitter boat 26, e.g., transistors Q1a and Q2a, is ON while the other transistor in the stage is OFF. As a result, the current through resistor R5 is n times the current through R1a, R3a, etc. Since the ratio between the resistance values of resistors R1a, R3a, etc. and the value of R5 is desirably n/2, as earlier noted, the voltage developed across R5 is always Vbe and the voltage developed across resistors R1a, R3a, etc. when the corresponding transistor of common emitter boat 26 is ON is ½Vbe. With this selection of the resistance value of R5 relative to the resistance value of resistors R1a, R3a, etc., currents flowing through the transistors in boat 26 are limited to a value considerably below the collector to emitter saturation current of the transistors in boat 26. As a result, transistors in boat 26 are not driven into saturation and are therefore able to operate at relatively high frequencies. Since resistance value ratios, compared to absolute resistance values, are readily controllable in integrated circuit structures, the tolerances of resistance values of resistors R5, R1a, R3a, etc., are relatively unimportant in integrated circuit 10.

The absolute value of R5 is selected as a compromise between a relatively high value on one hand to limit power consumption of integrated circuit 10 and a relatively low value on the other hand to provide sufficient current to the transistors of boat 26 to drive parasitic capacitive elements at relatively high speeds and to limit resistor size. The resistance values of resistors R2a, R4a, etc., are selected to have a relatively large value compared to the value of resistors R1a and R3a. This selection is to ensure that transistors Q3a, Q4a, Q5a and Q6a are not driven into saturation. Typical values for integrated circuit 10 are indicated in the following table:

| Element | Value |
| --- | --- |
| R1a, R3a, etc. | 2 kilohms |
| R2a, R4a, etc. | 15 kilohms |
| R5 | $\frac{4}{n}$ kilohms |
| +V | +2.8 volts |

Figure 5:
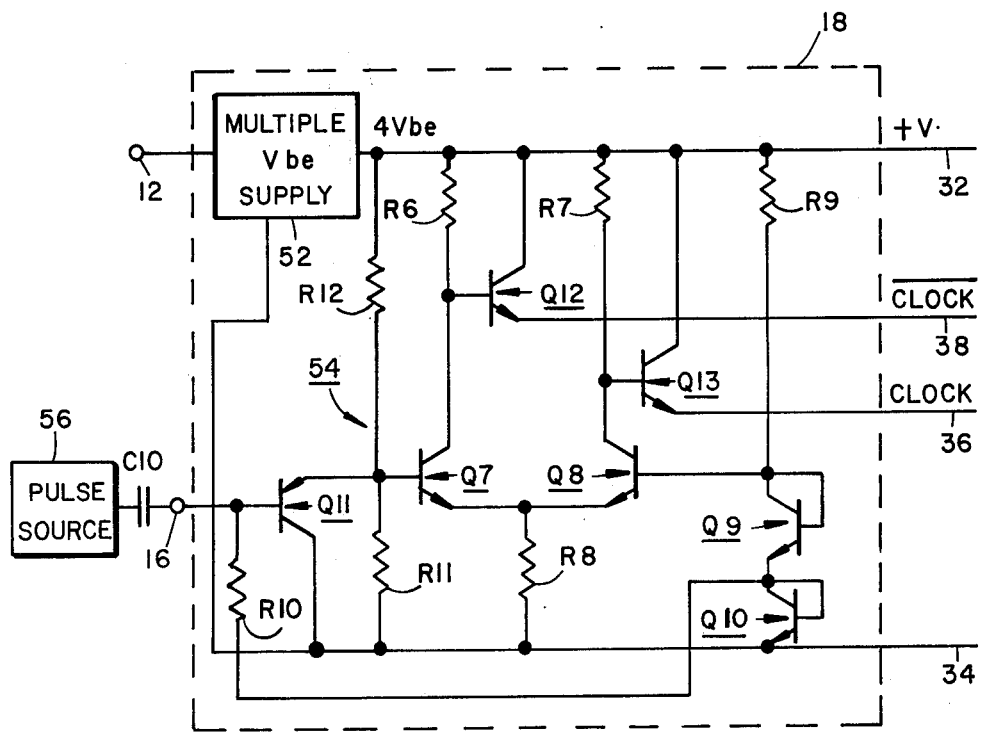
FIG. 5 shows in schematic form a portion of the integrated circuit structure shown in FIG. 1.

Circuitry 18 of integrated circuit 10, shown in FIG. 5, includes a multiple Vbe voltage supply circuit 52 and a clock amplifier 54. Multiple Vbe voltage supply circuit 52 derives a supply voltage of 4Vbe for clock amplifier 54 from the DC voltage applied to power input terminal 12. Multiple Vbe supply voltage circuit 52 may comprise any one of a number of well-known circuits for deriving supply voltages which are substantially equal to multiples of a base to emitter junction voltage drop from a relatively unregulated DC voltage. For example, multiple Vbe supply circuit 52 may comprise the type of circuit disclosed in U.S. Pat. No. 3,555,309 which is hereby incorporated by reference. Conveniently, the same supply voltage, i.e., 4Vbe, derived from clock amplifier 54 may also be utilized as the +V supply voltage coupled to the remainder of integrated circuit 10 through conductor 32.

Clock amplifier 54 includes an NPN transistor Q7 and an NPN transistor Q8 arranged together with resistors R6, R7 and R8 in a differential amplifier configuration. The base of transistor Q8 is coupled to the collector of an NPN transistor Q9 having its base and collector connected together to form a diode configuration. The collector of transistor Q9 is coupled to supply voltage conductor 34 through a resistor R9. The emitter of transistor Q9 is coupled to the collector of an NPN transistor Q10 which also has its base and collector connected to form a diode configuration. The emitter of transistor Q10 is connected to ground conductor 34. The emitter of transistor Q9 is also coupled through a resistor R10 to the base of a PNP transistor Q11 configured, together with resistors R11 and R12, as an emitter follower between clock input terminal 16 and the base of transistor Q7. The base of transistor Q11 is coupled through signal input terminal 16 and a capacitor C10 to the output of a pulse source 56. The collector of Q7 is coupled to $\overline{CLOCK}$ conductor 38 through an NPN transistor Q12 arranged as an emitter follower. Similarly, the collector of transistors Q8 is coupled to CLOCK conductor 36 through an NPN transistor Q13 also arranged as an emitter follower.

A voltage of 2Vbe is developed at the base of transistor Q8 because of the configuration of transistors Q9 and Q10 and also at the base of transistor Q7 because of the configuration of transistors Q10 and Q11. As a result, amplifier 54 is biased in a balanced configuration. When the output signal of pulse source 56 rises, transistor Q7 is turned ON and transistor Q8 is turned OFF. When the output of pulse source 56 falls, transistor Q7 is turned OFF and transistor Q8 is turned ON.

The voltage developed at the emitters of transistors Q7 and Q1 is 1Vbe. Resistors R6, R7 and R8 have the same resistance value, e.g., 2 kilohms. As a result, when transistor Q7 is ON, 1Vbe is developed across resistor R6. Accordingly, the voltage at the collector of transistor R6 is 3Vbe and the voltage at the emitter of transistor Q12 is 2Vbe. When transistor Q7 is OFF, substantially no voltage is developed across resistor R6 and the voltages at the collector of transistor Q7 and the emitter of transistor Q12 are 4Vbe and 3Vbe, respectively. By analogy, the voltage developed at the emitter of transistor Q13 also varies between 3Vbe and 2Vbe.

Circuit 18 may be constructed on the same substrate as the remaining portion of integrated circuit 10. As only one circuit such as circuit 18 is utilized in integrated circuit 10, for counters with a relatively large number of stages the size of integrated circuit 10 is not significantly increased. In this connection, it is also noted that other signal processing circuits, analog as well as digital, may be similarly incorporated in integrated circuit 10 with a few, if any, interfacing elements.

Thus, what has been described with specific reference to integrated circuit 10 is an integrated circuit, for dividing the frequency of one alternating signal, which has a relatively high density due to the use of a common emitter boat and a common collector boat and which can operate at relatively high speeds due to the biasing arrangement including transistors of the common collector boat.

While the collector resistors of the transistors in common emitter boat 26 in the above described embodiment are desirably selected to have a value such that the voltage developed across them is ½Vbe when the associated transistor is conductive so that only one of the transistors in boat 26 of a stage is conductive at a time, it should be understood that is only necessary, in the particular circuit arrangement shown in FIG. 1, that this voltage not exceed 1Vbe. Thus, in the particular circuit arrangement shown in FIG. 1, it is only necessary that the collector resistors of the transistors in boat 26 have a value less than the multiplicative product of n and the value of resistor R5. However, the selection of the value of the collector resistors of the transistors in boat 26 equal to approximately one half the multiplicative product of n and the value of resistor R5 ensures a tolerance well within the possible Vbe variations.

In addition, while the invention has been described as having stages with similar transistors and resistors in respective circuit portions, it is contemplated that transistors and resistors having different characteristics and values may be utilized in different stages. For example, when integrated circuit 10 is to be utilized to divide the frequency of a relatively high frequency signal, it may be desirable that the first or first few stages be capable of operating at higher speeds than the remaining stages. To accomplish this, the collector resistors of the transistors in common emitter boat 26 of earlier stages should be selected to have lower values than the collector resistors of the transistors in common emitter boat 26 of the later stages and the emitter regions of transistors in common emitter boat 26 of earlier stages should be selected larger than the emitter regions of the transistors in common emitter boat 26 of later stages. In such an arrangement, so that the voltage developed across the collector resistors of the transistors in common emitter boat 26 in a stage is still approximately equal to the desirable value of ½Vbe when the associated transistors in common emitter boat 26 are conductive, it is desirable that the collector resistors of that stage have a value RC related to the value, R5, of resistor R5 by the expression:

$$R5 = 2RC\left(\frac{ES}{ET}\right) \qquad (1)$$

where ES is the total area of the emitters of the two transistors in boat 26 in that stage and ET is the total emitter area of all the transistors in boat 26.

Furthermore, although the invention has been described in terms of an integrated circuit structure arranged in a closed loop configuration as a frequency divider, a similar structure may be employed in an open loop configuration such as in a shift register arrangement. Furthermore, the same type of structure may be employed in other closed loop configurations. For example, it is contemplated that logic circuitry may be added to inject binary information between cascaded stages so as to form, for example, a dual modulus divider capable of dividing by two division factors or to reset or preset the divider at or to predetermined counts. These and other modifications are contemplated to be within the scope of the present invention as defined by the following claims.

What is claimed is:

1. An integrated circuit for dividing the frequency of an alternating signal by a number n, at least equal to two, comprising:

a substrate of a first type of semiconductor material;
   first and second boats of a second type of semiconductor material formed on said substrate, said first and second boats divided by an area of said first type of semiconductor material;
   a first plurality of bipolar transistors having base, emitter and collector regions formed in said first boat, said first plurality of transistors sharing a common emitter region;
   a second plurality of bipolar transistors having base, emitter and collector regions formed in said second boat, said second plurality of transistors sharing a common collector region;

first and second sources of operating potential, said first source of operating potential coupled to said common collector region of said second boat;

clock means for generating first and second complementary clock signals having first and second predetermined levels in response to said alternating signal;

n stages coupled in cascade, each stage including at least two transistors of said first boat cross coupled to at least two transistors of said second boat to form a flip-flop configuration, every other one of said stages being coupled to said first clock signal and the remaining ones of said stages being coupled to said second clock signal;

each stage including biasing means including at least said two transistors of said second boat in said stage for causing only one of said two transistors of said first boat in said stage to be conductive of a current less than its saturation current and the other one of said two transistors of said first boat in said stage to be nonconductive independent of the level of the associated one of said first and second clock signals; and coupling means for coupling signals representing the conductive state of said two transistors of said first boat in said stage to the next stage in response to one of said predetermined levels of the associated one of said first and second clock signals, said two transistors of said first boat of said next stage changing conductive stages in response thereto.

2. The apparatus recited in claim 1 wherein:

in each stage each of said two transistors of said first boat is included in a common emitter amplifier configuration having an input at its base region and an output at its collector region and each of said two transistors of said second boat is included in an emitter follower amplifier configuration having an input at its base region and an output at its emitter region, the output of one of said emitter follower amplifiers being direct current coupled to the input of one of said common emitter amplifiers, the output of said one common emitter amplifier being direct current coupled to the input of the other emitter follower amplifiers, the output of said other emitter follower amplifier being direct current coupled to the input of the other common emitter amplifier, the output of said other common emitter amplifier being direct current coupled to the input of said one emitter follower amplifier; and said coupling means includes an additional two transistors of said second boat, each of said two additional transistors being included in an emitter follower configuration direct current coupled between the emitter of one of said two transistors of said stage in said second boat and the emitter of one of said two transistors of said next stage.

3. Apparatus recited in claim 2 wherein:

each of said stages including first, second, third, fourth, fifth and sixth bipolar transistors of the same conduction type, said first and second transistors being formed in said first boat, said third, fourth, fifth and sixth transistors being formed in said second boat, the collector region of said first transistor being direct current coupled to the base region of said third transistor, the collector region of said second transistor being direct current coupled to the base region of said fourth transistor, the emitter region of said fourth transistor being direct current coupled to the base region of said first transistor, the emitter region of said third transistor being direct current coupled to the base region of said second transistor, a first resistor direct current coupled between the base region of said third transistor and said clock means to receive one of said first and second clock signals, a second resistor direct current coupled between the emitter region of said third transistor and said second source of said second operating potential, a third resistor, substantially equal in value to the value of said first resistor, being direct current coupled between the base region of said fourth transistor and said clock means to receive said one of said first and second clock signals, a fourth resistor direct current coupled between the emitter region of said fourth transistor and said second source of said second operating potential, the base region of said fifth transistor being direct current coupled to the base region of said third transistor, the base region of said sixth transistor being direct current coupled to the base region of said fourth transistor;

said n stages being coupled in cascade with the emitter regions of said fifth and sixth transistors of each of n−1 of said stages being direct current coupled to the emitter regions of said third and fourth transistors, respectively, of the next stage and the emitter regions of said fifth and sixth transistors of the remaining one of said stages being direct current coupled to the emitter regions of said fourth and third transistors, respectively, of the next stage; and a fifth resistor direct current coupled between said common emitter region of said first boat and said source of said second operating potential.

4. The apparatus recited in claim 3 wherein said clock means causes the difference between said first and second predetermined levels of said first and second clock signals to be substantially equal to Vbe, where Vbe is the voltage developed between the base regions and the emitter regions of said plurality of transistors in said first boat when they are conductive; and said first and third resistors have values less than the multiplicative product of n and the value of said fifth resistor.

5. The apparatus recited in claim 4 wherein said first and third resistors have values at least approximately equal to the multiplicative product of n/2 and the value of said fifth resistor.

6. Apparatus recited in claim 5 wherein the collector region of said first transistor is directly connected to the base region of said third transistor, the collector region of said second transistor is directly connected to the base region of said fourth transistor, the emitter region of said fourth transistor is directly connected to the base region of said first transistor, the emitter region of said third transistor is directly connected to the base region of said second transistor, said first resistor is directly connected between the base region of said third transistor and said clock means to receive one of said first and second clock signals, said second resistor is directly connected between the emitter region of said third transistor and said second source of said second operating potential, said third resistor is directly connected between the base region of said fourth transistor and said clock means to receive said one of said first and second clock signals, said fourth resistor is directly connected between the emitter region of said fourth transistor and said second source of said second operating potential, the base region of said fifth transistor is directly connected to the base region of said third transistor, the base region of said sixth transistor is directly connected to the base region of said fourth transistor;

the emitter regions of said fifth and sixth transistors of each of n−1 of said stages is directly connected to the emitter regions of said third and fourth transistors, respectively, of the next stage and the emitter regions of said fifth and sixth transistors of said remaining one of said stages is directly connected to the emitter regions of said fourth and third transistors, respectively, of the next stage;

said fifth resistor is directly connected between said common emitter region of said first boat and said source of said second operating potential; and said clock means cause said first predetermined level to substantially equal 2Vbe and said second predetermined level to substantially equal 3Vbe.

7. The apparatus recited in claim 6 wherein said fifth resistor includes an area of said first type of semiconductor material in said second boat.

8. The apparatus recited in claim 7 wherein
said third and fifth transistors share a common base region; and
said fourth and sixth transistors share another common base region.

9. The apparatus recited in claim 8 wherein
said first type of semiconductor is P material;
said second type of semiconductor material is N material;
said area dividing said first and second boats is P+ type material;
said transistors in said first and second boats are NPN transistors; and
an area of N+ type material surrounds at least a portion of each of said transistors in said first boat.

10. The apparatus recited in claim 9 wherein
said area dividing said first and second boats has a width which is at least approximately twice the width of the areas surrounding said transistors of said first boat.

* * * * *

UNITED STATES PATENT AND TRADEMARK OFFICE
CERTIFICATE OF CORRECTION

PATENT NO. : 4,200,811

DATED : April 29, 1980

INVENTOR(S) : Alvin R. Balaban and Steven A. Steckler

It is certified that error appears in the above-identified patent and that said Letters Patent is hereby corrected as shown below:

Col. 6, line 16, "needed" should be --indeed--.
Col. 6, line 44, omit ";b".
col. 6, line 64, "bacause" should be --because--.
Col. 7, line 14, "base of emitter" should be --base to emitter--.
Col. 7, line 59, after "E5b" add --and E6b--.
Col. 9, line 11, "transistors" should be --transistor--.
Col. 9, line 44, omit "a".
Col. 9, line 60, insert --it-- between "that is".

Signed and Sealed this

Fifth Day of August 1980

[SEAL]

Attest:

SIDNEY A. DIAMOND

Attesting Officer

Commissioner of Patents and Trademarks